(12) United States Patent
Amano

(10) Patent No.: US 6,401,359 B1
(45) Date of Patent: Jun. 11, 2002

(54) VACUUM PROCESSING METHOD AND APPARATUS

(75) Inventor: Hideaki Amano, Zama (JP)

(73) Assignee: Tokyo Electron Limited, Tokyo-to (JP)

(*) Notice: Subject to any disclaimer, the term of this patent is extended or adjusted under 35 U.S.C. 154(b) by 0 days.

(21) Appl. No.: 09/655,375

(22) Filed: Sep. 5, 2000

Related U.S. Application Data

(63) Continuation of application No. PCT/JP99/03441, filed on Jun. 28, 1999.

(30) Foreign Application Priority Data

Jun. 30, 1998 (JP) .......................................... 10-201285

(51) Int. Cl.⁷ ................................................ F26B 5/04
(52) U.S. Cl. ................................ 34/402; 34/92; 34/72; 34/389; 34/380; 34/531; 34/558; 438/716
(58) Field of Search ........................ 34/380, 388, 402, 34/531, 558, 92, 72, 389; 438/710, 714, 715, 716

(56) References Cited

U.S. PATENT DOCUMENTS

| | | | | |
|---|---|---|---|---|
| 4,931,135 A | * | 6/1990 | Horiuchi et al. | 216/67 |
| 5,344,542 A | * | 9/1994 | Maher et al. | 204/298.15 |
| 5,583,737 A | * | 12/1996 | Collins et al. | 361/234 |
| 5,777,838 A | * | 7/1998 | Tamagawa et al. | 361/234 |
| 5,906,684 A | * | 5/1999 | Tamura et al. | 118/728 |

FOREIGN PATENT DOCUMENTS

| | | |
|---|---|---|
| JP | 3-105917 | 5/1991 |
| JP | 5-13350 | 1/1993 |
| JP | 7-169825 | 7/1995 |
| JP | 10-240356 | 9/1998 |

\* cited by examiner

*Primary Examiner*—Ira S. Lazarus
*Assistant Examiner*—Kathryn S. O'Malley
(74) *Attorney, Agent, or Firm*—Finnegan, Henderson, Farabow, Garrett & Dunner LLP

(57) ABSTRACT

A semiconductor wafer (W) is mounted on top of a mounting stand (3) within a vacuum vessel of a vacuum processing apparatus such as a vacuum film-formation apparatus or an etching apparatus for semiconductor wafers. A heat-transfer gas such as helium is supplied to a gap between the wafer and the mounting stand, and film-formation or etching is performed while the wafer is held at a predetermined temperature. To ensure a simple and reliable detection of any leakage of the helium from between the wafer and the mounting stand during this process because of an abnormal state, the surface of a dielectric material such as aluminum nitride that configures the mounting stand (3) is given a mirror finish and the wafer (W) is attracted to the surface of the mounting stand (3) by an attractive force of at least 1 kg/cm², whereby the helium from the gas supply path (5) is sealed in on the rear surface side of the wafer (W). A flowmeter (54) is provided in the gas supply path (5), a flowrate measured by this flowmeter is compared by a comparator (6) against a threshold value, which corresponds to a flowrate that occurs when a leakage is generated between the rear surface side of the wafer (W) and the surface of the mounting stand (3) in a normal state, and an abnormality signal is generated if the measured flowrate exceeds the threshold value. This ensures that the temperature of the wafer can be maintained accurately.

7 Claims, 5 Drawing Sheets

VACUUM PROCESSING METHOD AND APPARATUS

CROSS REFERENCE TO RELATED DOCUMENTS

This application is a Continuation of International Application No. PCT/JP99/03441, filed Jun. 28, 1999.

TECHNICAL FIELD

The present invention relates to a vacuum processing method and apparatus for subjecting an object to be processed, such as a semiconductor wafer, to vacuum processing.

BACKGROUND ART

When a semiconductor wafer (hereinafter abbreviated to "wafer") is to be subjected to processing in a vacuum, helium (He) which is a heat-transfer gas flows into a space between the wafer and the mounting stand on which the wafer is mounted, heat is transferred by that helium between the wafer and the mounting stand, and thus the wafer is maintained at a predetermined temperature. The gap between the wafer and the mounting stand is extremely small, but it could become larger. If reaction products that have been deposited on the inner walls of the vacuum chamber during a process such as chemical vapor deposition (CVD) or etching should fall onto the mounting stand as particles, and then a wafer is placed on the mounting stand in that state, the particles could come between the surface of the mounting stand and the wafer, thus increasing the gap therebetween. In addition, an abnormality could occur in the electrostatic chuck within the mounting stand during the processing, which would also increase the gap between the wafer and the mounting stand. Similarly, if the position of the wafer on the wafer conveyor arm should slip, the wafer could be placed away from the helium gas ejection holes that open onto the surface of the mounting stand.

If there is any such vertical displacement of the wafer from the mounting stand or an error in the position of the wafer, the thermal transfer state between the wafer and the mounting stand will change, so that the temperature of the wafer could drift away from the predetermined temperature locally and thus variations could occur in the film formation or etching process. An apparatus such as that illustrated in FIG. 5 is used to detect any abnormal mounting state of the wafer beforehand, when the wafer has been placed on the mounting stand.

In FIG. 5, reference number 1 denotes a helium supply source, 12 denotes a mounting stand for a wafer W, and 11 denotes a gas supply path for supplying helium to the mounting stand 12. A valve 16 is provided in the gas supply path 11. Reference number 13 denotes a pressure controller that compares the gas pressure within the gas supply path 11, measured by a gas pressure gauge 14, with a set pressure, adjusts a pressure adjustment valve 15 in such a manner that the difference therebetween becomes zero, and thus controls the gas pressure within the gas supply path 11 so that it becomes equal to the set pressure.

In this case, the degree of opening of the pressure adjustment valve 15 when the wafer W is mounted correctly on the mounting stand 12 is previously stored as a normal value in a memory (not shown in the figure), a detection signal that corresponds to the degree of opening of the pressure adjustment valve is compared with a threshold value by a comparator 17, and, if the detection signal is greater than the threshold value, an abnormality detection signal is output and the operation is halted.

In the above described pressure adjustment valve 15, the relationship between the set pressure of helium and the degree of opening of the valve during normal operation is as shown by the solid line in FIG. 6 and that during abnormal operation is as shown by the broken line in FIG. 6. It is clear from this figure that the degree of opening of the valve varies far more than the set pressure of the gas but, on the other hand, the difference between the degree of opening of the valve during normal operation and the degree of opening of the valve during abnormal operation is small. This means that threshold value of the comparator 17 must be varied depending on the value of the set pressure. This is troublesome.

Moreover, if the original pressure of the helium is changed, as shown by way of example in FIG. 7, the relationship between the degree of opening of the valve and the set pressure during normal operation will also change. This makes it difficult to set the threshold value of the comparator 17 and there is a danger that even if detection is performed correctly during abnormal operation, the abnormality detection signal may be generated even during normal operation.

The present invention was devised in the light of the above described problems and has as an object thereof the provision of a technique that makes it possible to detect any leakage of a heat-transfer gas that is supplied into a gap between an object to be processed, such as a substrate, and the mounting stand, in a simple and accurate manner.

DISCLOSURE OF THE INVENTION

The present invention provides a vacuum processing method wherein a heat-transfer gas, which enables thermal transfer between an object to be processed and an electrostatic chuck, is supplied to the object to be processed that is mounted on top of the electrostatic chuck, and a predetermined processing is performed, wherein: the method comprises the steps of measuring a flowrate of the heat-transfer gas while the heat-transfer gas is being supplied; and determining whether an abnormality exists in the mounting state of the object to be processed, on the basis of the thus measured value.

A vacuum processing apparatus in accordance with the present invention comprises: a vacuum processing vessel for performing vacuum processing on an object to be processed; a mounting stand provided within the vacuum processing vessel and having a surface on which the object to be processed is mounted; heat-transfer gas ejection holes formed in the surface, to supply a heat-transfer gas into a gap formed between the object to be processed and the surface in order to maintain the object mounted on the surface of the mounting stand at a predetermined temperature; a gas supply path for supplying a heat-transfer gas to the gas ejection holes; a heat-transfer gas supply source connected to the gas supply path; a pressure adjustment device provided in the gas supply path, for adjusting the pressure of the heat-transfer gas within the gas supply path; a flowmeter provided in a downsteam side of the gas supply path from the pressure adjustment device, for measuring the flowrate of the heat-transfer gas towards the gas ejection holes; and a comparator for comparing the flowrate measured by the flowmeter against a threshold value, which corresponds to a flowrate measured by the flowmeter when the heat-transfer gas is leaking from between the object and the surface of the mounting stand in a normal state, and outputting a detection signal if the measured flowrate exceeds the threshold value.

This invention detects any leakage of the heat-transfer gas from between the wafer and the mounting stand that exceeds the threshold value that has been set beforehand, by monitoring the flowrate of the heat-transfer gas, which makes it possible to detect an abnormal gas leakage in a simple manner, even if the set pressure of the heat-transfer gas should change but there is no change in the set flowrate when an abnormal leakage state is generated. In addition, this invention enables early detection of mis-positioning of the object, on the surface of the mounting stand, warping of the object, or damage or the like, by detecting any gas leakage of a flowrate that exceeds the threshold value.

The apparatus of the present invention is preferably further provided with a pressing means for pressing the object to be processed onto the surface of the mounting stand, to ensure that there is no non-uniformity in the thermal transfer between the object and the mounting stand caused by warping of the object to be processed. In this case, the mounting stand is formed of a dielectric material and the pressing means is an electrostatic chuck comprising electrodes for electrostatic attraction that are provided adjacent to the surface of the mounting stand. In addition, if the pressure adjustment device is adjusted in such a manner that the gas in the gas supply path has a preset pressure that is selected from within the range of 1 to 20 Torr, the relationship between the gas pressure and the temperature of the object to be processed becomes linear, making it possible to control the temperature of the object to be processed to a high degree of accuracy.

The method of supplying the heat-transfer gas could be such that the gas is sealed between the object to be processed and the mounting stand by a configuration such that a mirror finish is formed on the surface of the mounting stand and the pressing means is set to press the object to be processed against the surface of the mounting stand with a pressure of at least 500 g/cm$^2$. It should be noted, however, that an extremely small amount of gas will leak in practice, even with this sealing configuration. Examples of vacuum processing in accordance with this invention include film-formation and etching.

BEST MODE FOR CARRYING OUT INVENTION

Figure 1:
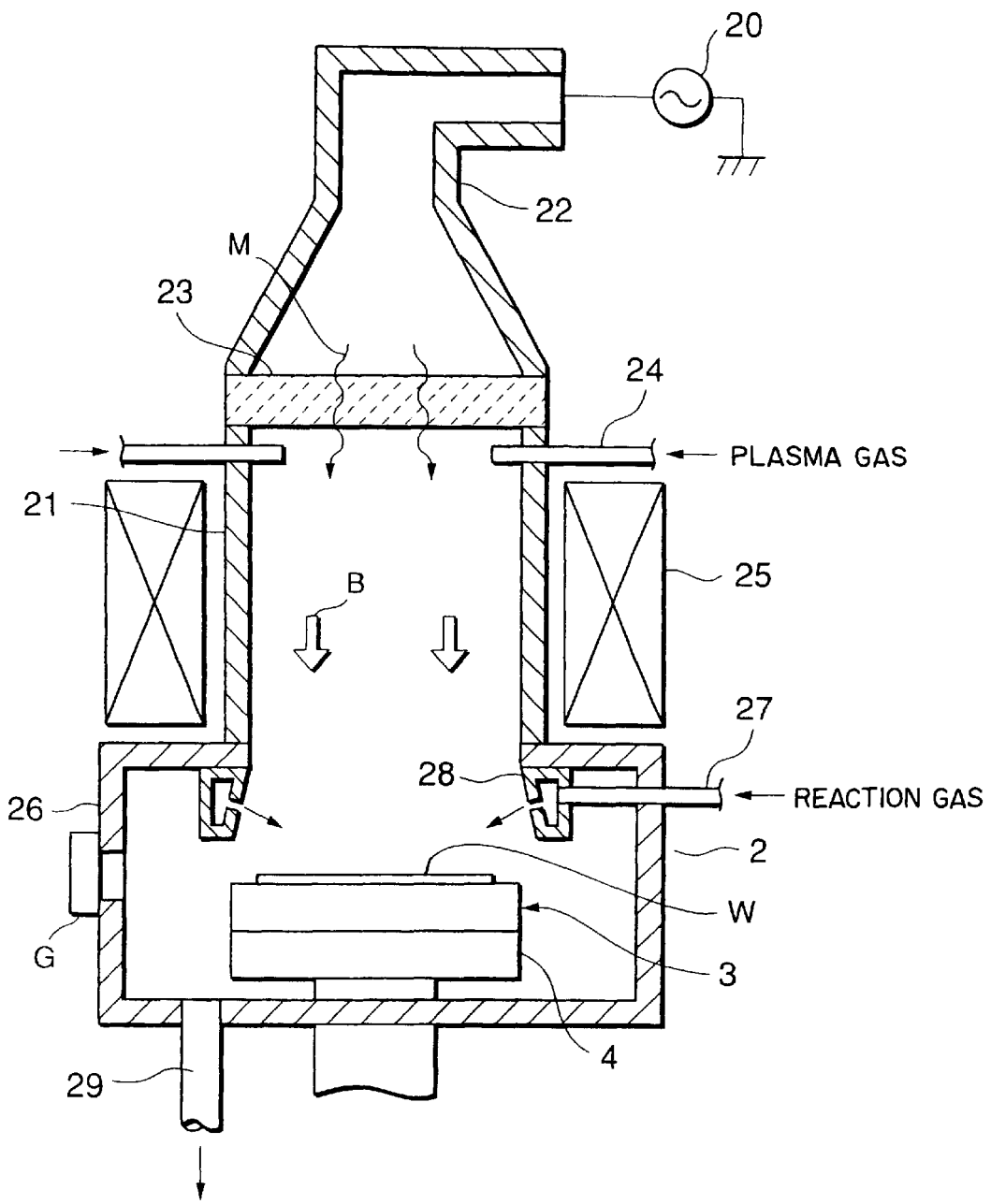
FIG. 1 is a section through a vacuum processing apparatus in accordance with the present invention, illustrating an embodiment thereof applied to a plasma processing apparatus that uses ECR.

The description below relates to an embodiment of the present invention that is applied to a CVD apparatus using electron cyclotron resonance (ECR). The overall configuration of a plasma chemical vapor deposition (CVD) apparatus will first be described briefly with reference to FIG. 1. This apparatus is configured in such a manner that microwaves M at, for example, 2.45 GHz from a radio-frequency power source 20 are guided from a waveguide 22 and through a transparent window 23 into a plasma chamber 21 on an upper side of a vacuum vessel 2, a plasma gas such as Ar or $O_2$ is also supplied into the plasma chamber 21 from plasma gas nozzles 24, and electronic cyclotron resonance is generated by the application of a magnetic field B from an electromagnetic coil 25 provided outside the plasma chamber 21.

The configuration is further such that a reactive gas is supplied into a reaction chamber 26 on a lower side of the vacuum vessel 2 through an annular reactive gas supply member 28 to which is connected a reaction gas nozzle 27. An exhaust pipe 29 is connected to a bottom portion of the reaction chamber 26. A mounting stand 3 for holding a wafer that is the substrate to be processed is provided in the interior of the reaction chamber 26. A known type of gate valve G is provided in the reaction chamber 26.

Figure 2:
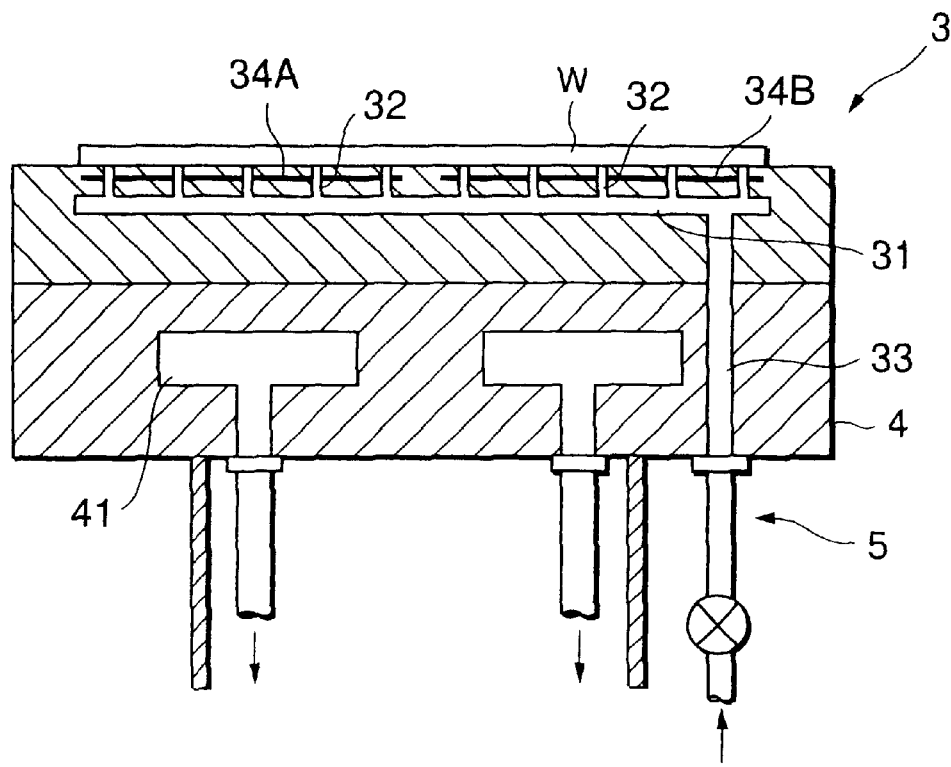
FIG. 2 is a section through the mounting stand of this embodiment.

The mounting stand 3 is formed of a dielectric material such as aluminum nitride or alumina and is provided on top of a mounting stand support 4, as shown in more detail in FIG. 2. A ventilation chamber 31 of substantially the same size as a wafer W, by way of example, is formed within the mounting stand 3 and a large number of gas ejection holes 32 that penetrate the surface of the mounting stand 3 are formed in the upper surface of this ventilation chamber 31. A gas supply pipe 33 is connected to the ventilation chamber 31. The gas supply pipe 33 penetrates through the mounting stand 3 and the mounting stand support 4 and extends to the exterior. A gas supply path 5 is created by the ventilation chamber 31, the gas ejection holes 32, and the gas supply pipe 33.

Electrodes for an electrostatic chuck, such as electrodes 34A and 34B of a twin-electrode type, are embedded close to the surface of the mounting stand 3 and the wafer W is attracted to that surface by an electrostatic force generated in the surface of the dielectric material thereof by applying a DC voltage from a direct-current power source (not shown in the figure) between these electrodes 34A and 34B. Grooves of a mesh form, by way of example, are formed in the surface of the mounting stand 3 (the dielectric material). These grooves could be omitted, but the presence of such grooves has the advantage of enabling easy removal of the wafer if the power source of the electrostatic chuck should fail, even if there is some residual voltage there. Note that a heater (not shown in the figure) is also provided within the mounting stand 3. In this embodiment, an electrostatic chuck that is a pressing means is configured of the electrodes 34A and 34B, the dielectric material, and the direct-current power source.

Coolant passageways 41 are formed within the mounting stand support 4, which is maintained at a temperature of 150° C., by way of example, by a flow of coolant that is introduced from the exterior into the coolant passageways 41. The temperature of the mounting stand 3 is maintained at 250° C., by way of example, by a combination of the action of the internal heater and the temperature of the mounting stand support 4.

Figure 3:
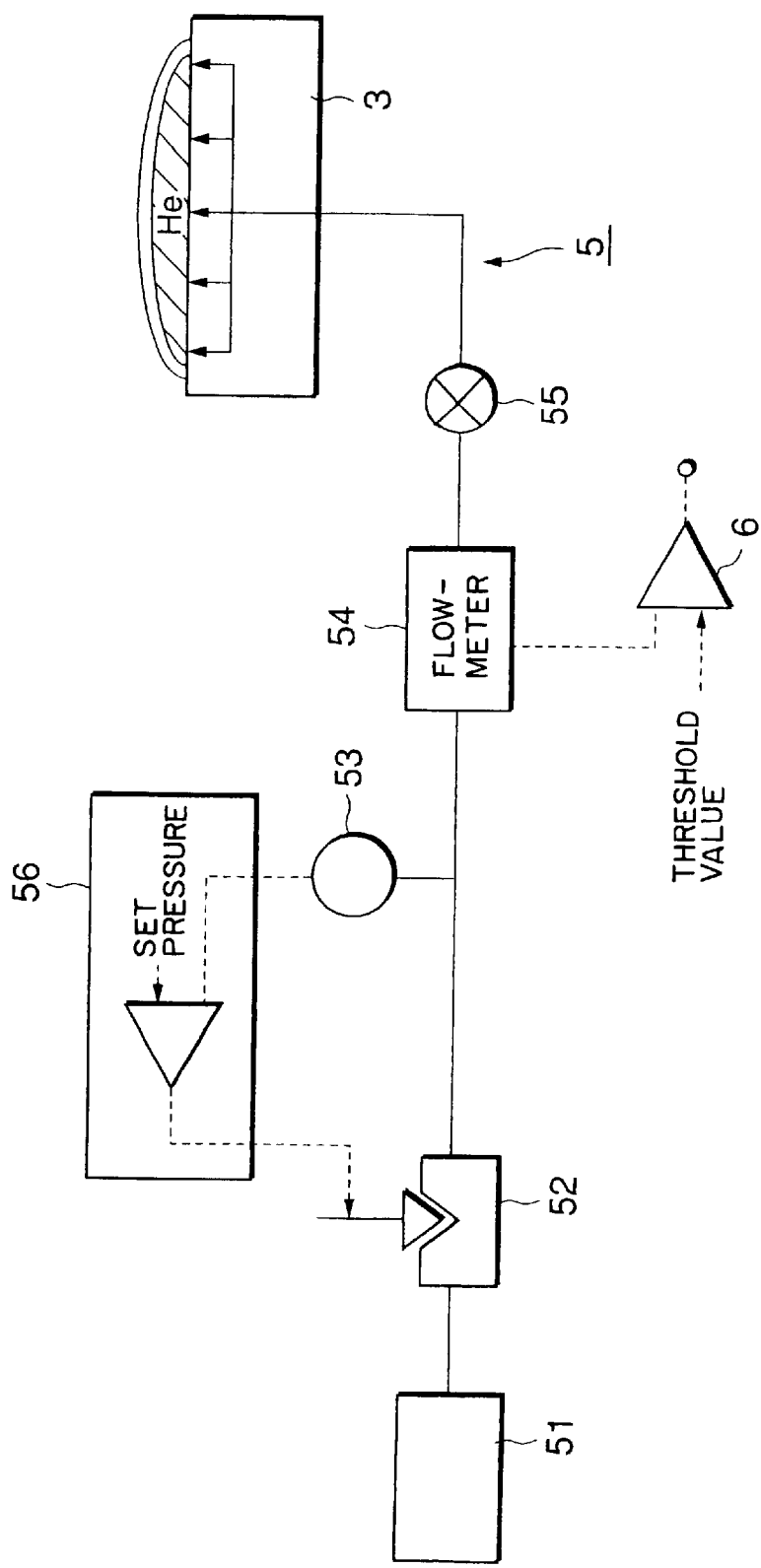
FIG. 3 shows the structure of a supply system for supplying helium into the gap between the mounting stand of this embodiment and the wafer, together with the configuration for abnormality detection.
Figure 5:
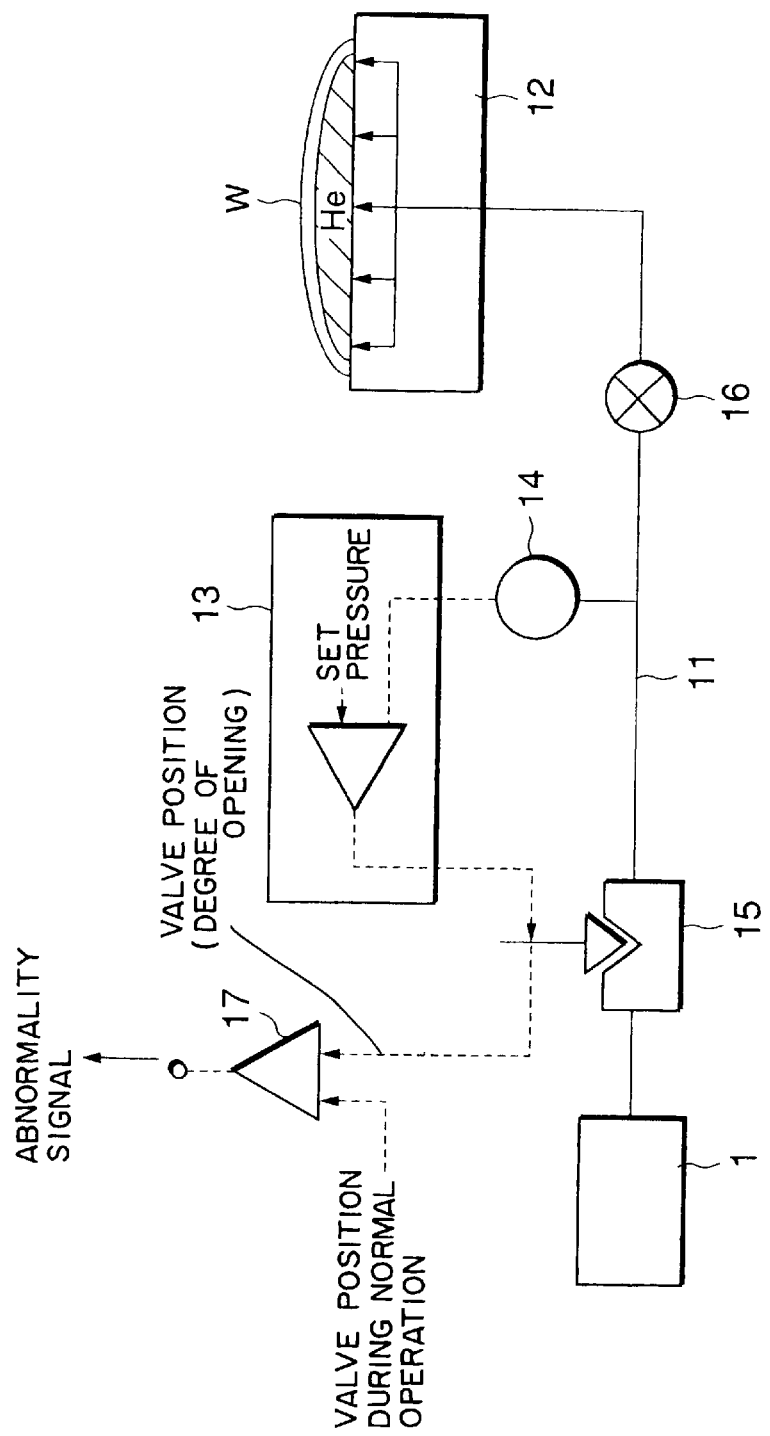
FIG. 5 shows the structure of essential components of a prior-art vacuum processing apparatus.
Figure 6:
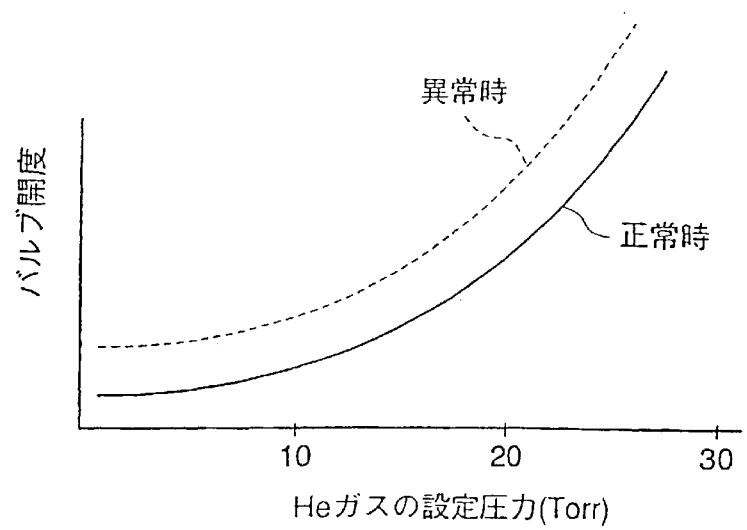
FIG. 6 is a graph of the relationship between flowrate and helium supply pressure in the prior-art vacuum processing apparatus.
Figure 7:
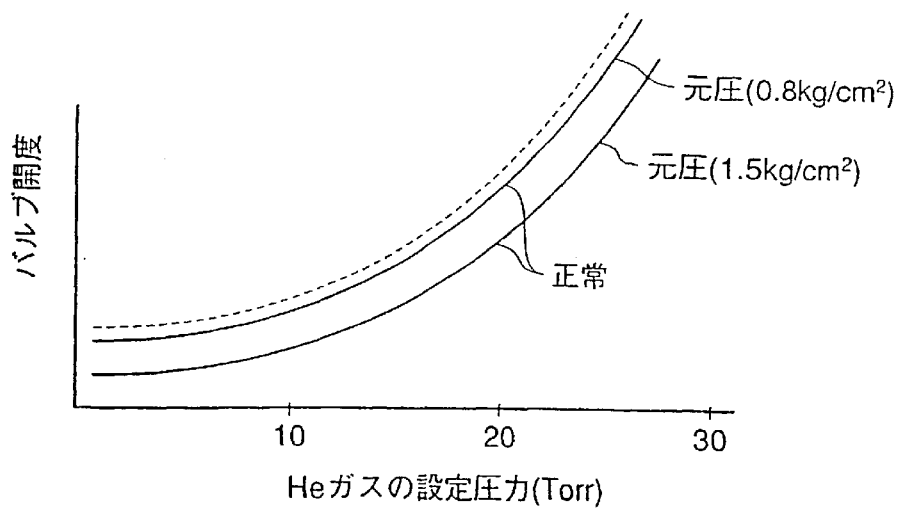
FIG. 7 is a graph of the relationship between flowrate and helium supply pressure in the prior-art vacuum processing apparatus, using original pressure as a parameter.

Essential components of this embodiment of the invention will now be described with reference to FIG. 3. FIG. 3 shows the gas supply system for supplying a heat-transfer gas (also called a backside gas) from the surface of the mounting stand 3. A gas supply source 51 for helium is provided at an upstream end portion of the gas supply path 5, and a pressure adjustment valve 52, a pressure gauge 53, a flowmeter 54, and a valve 55 are provided in the gas supply path 5, in that order from the upstream side. Reference numeral 56 denotes a pressure controller which exerts control in such as manner that it adjusts the pressure adjustment valve 52 on the basis of a pressure detection value of the pressure gauge 53 so that the detected value become a predetermined pressure. The flowrate measured by the flowmeter 54 is input as an electrical signal to a comparator 6, which is a comparison means. This comparator 6 compares a predetermined threshold value and the measured flowrate value, and outputs an abnormal detection signal if the measured flowrate is greater than the threshold value.

This threshold value could be determined as described below, by way of example. The configuration could be such that the force of attraction between the wafer W and the mounting stand 3 is increased by giving the surface of the mounting stand 3 a mirror finish and using an attractive force of, for example, at least 800 g/cm$^2$ to press (attract) the wafer W to the mounting stand 3, and also helium is sealed in between the wafer W and the surface of the mounting stand 3. It should be noted, however, that in practice an extremely small amount of helium will leak into the vacuum vessel 2, even if the helium is said to be sealed in. If the set pressure of the helium is 10 Torr, by way of example, approximately 0.3 sccm of helium will leak out.

Figure 4:
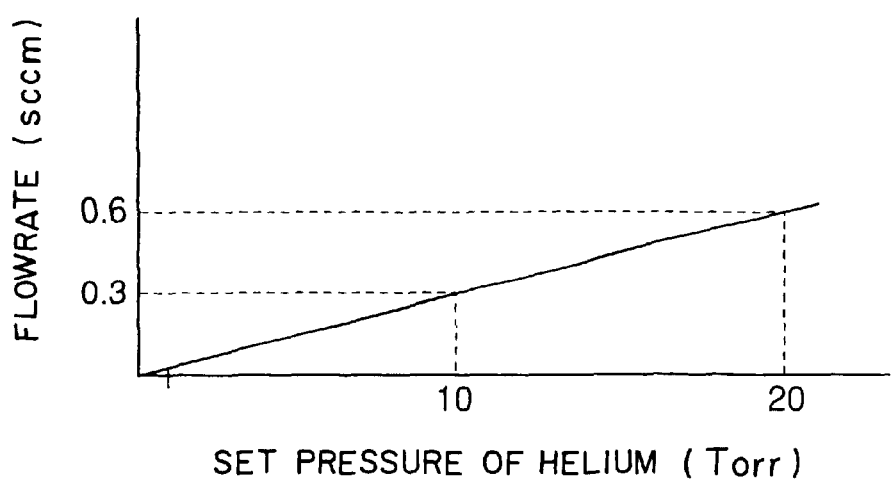
FIG. 4 is a graph of the relationship between flowrate and helium supply pressure in accordance with this embodiment of the invention.

With chemical vapor deposition (CVD) processing, by way of example, it is necessary to control the temperature of the wafer W extremely precisely in order to ensure good uniformity of the film thickness, and thus the pressure of helium is controlled to be within the range of 1 to 20 Torr. This is because the pressure and the heat conductivity of helium within this pressure range are in a linear relationship (in other words, the two can be expressed by a linear approximation), so that it is possible to control the temperature of the wafer W in a highly precise manner by adjusting the pressure of helium. The linear relationship between the pressure and flowrate of helium is shown in FIG. 4 for reference. If a gap is created between the wafer W and the mounting stand 3 by the presence of particles, the flowrate of helium will increase greatly even if those particles are very small, and thus the flowrate could increase to more than approximately 3 sccm for a set pressure of 10 Torr, by way of example. If the threshold value is therefore set to 1.5 sccm (0.3 sccm×5, to give a margin of safety of 5 to allow for variations in the apparatus when the flowrate during normal operation is 0.3 sccm), it becomes possible to accurately detect an abnormality if the mounting state of the wafer W is abnormal and also ensure there is no danger of the abnormality detection signal being generated when the state is normal.

The description now turns to the operation of the above described embodiment of the invention. First of all, the gate valve G is opened and a wafer that is a substrate to be processed is conveyed out from a load lock chamber (not shown in the figure) and onto the mounting stand 3. This conveying is done by the cooperative actions of a known elevating pin and a conveyor arm (not shown in the figure) provided on the side of the mounting stand 3. A voltage is then applied between the electrostatic attraction electrodes 34A and 34B to attract the wafer W electrostatically to the mounting stand 3 (dielectric material) by an attractive force of at least 500 g/cm$^2$, such as 800 g/cm$^2$ by way of example. The valve 55 is opened to supply helium from the gas supply source 51 through the gas supply path 5 and into the gap between the mounting stand 3 and the wafer W.

At the same time, a plasma gas such as argon and a reactive gas such as $C_2H_4$ are introduced at respective predetermined flowrates from the plasma gas nozzle 24 and from the reaction gas nozzle 27, respectively, while the interior of the vacuum vessel 2 is maintained at a pressure of 1.5 mTorr, for example. The reactive gas is activated by the plasma ions flowing into the reaction chamber 26, which causes the formation of a film of a substance such as CF (a fluorocarbon film) on the wafer W. During this time, the wafer W is heated by the plasma and this heat is transferred by the helium on the rear surface side of the wafer to the side of mounting stand 3, which ensures that the wafer W is heated to a predetermined temperature such as 400° C.

If the wafer W is currently mounted correctly on the mounting stand 3 in this case, the amount of leakage of gas is 0.3 sccm when the set pressure of the helium is 10 Torr, by way of example, and the abnormality detection signal is not output. If there are particles between the wafer W and the mounting stand 3 so that the amount of escaping helium exceeds the threshold value of 1.5 sccm, on the other hand, the value measured by the flowmeter 54 becomes greater than the threshold value and the abnormality detection signal is output from the comparator 6. If this abnormality detection signal is output, an alarm or the like is generated, no processing is performed on the wafer W, and that wafer W is conveyed out. If the abnormality detection signal is generated during the processing, the generation of microwaves is halted and the processing stops.

The above described embodiment of the present invention measures the flowrate of helium and monitors the leakage state of the helium on the rear surface side of the wafer W from the thus-measured flowrate. As described above, the relationship between the set pressure and the flowrate is substantially linear. There is a constant very small leakage in the flowrate when the wafer W is mounted correctly on top of the mounting stand 3, but this flowrate will increase if there is a tiny particle between the wafer W and the mounting stand 3, because of the resultant small gap between the wafer W and the mounting stand 3. This flowrate increase is independent of the relationship between the pressure and flowrate of the helium supply source. It is therefore possible to set the threshold value of the flowrate to be constant (such as 3 sccm), regardless of the set pressure. As a result, the flowrate can be set in a simple manner and also abnormalities can be detected reliably, so there is no danger of a normal state being misinterpreted as an abnormal state.

The threshold value for the flowrate could be made constant regardless of the set pressure, or it could be varied in accordance with the set pressure. A device that is integrated with the pressure adjustment valve 52 could be used as the flowmeter. In addition, a flowrate adjustment valve could be used instead of the pressure adjustment valve as the pressure adjustment means, in which case a device that integrates the flowmeter and the flowrate adjustment valve (a pressure adjustment means) could be used therefor.

The present invention is not limited to use in a film-formation apparatus such as a CVD apparatus and thus it could be used in the previously mentioned plasma processing apparatus, and it could also be applied to the etching of an $SiO_2$ film by a CF-type gas. In addition, the helium gas is not limited to being sealed between the wafer W and the mounting stand 3 and thus the configuration could be such that there is no mirror finish to the surface of the mounting stand 3, by way of example, so that there the gap between the two components is large, making the leakage rate of the helium much greater than the previously described leakage rate. Note that it is preferable that the leakage rate during etching does not exceed 2 sccm. In addition, the heat-transfer gas could be a gas other than helium.

The present invention enables a simple and reliable detection of any abnormal leakage of a heat-transfer gas that is supplied between a substrate and a mounting stand.

What is claimed is:

1. A vacuum processing method wherein a heat-transfer gas, which enables thermal transfer between an object to be processed and a mounting stand, is supplied to said object to be processed that is mounted on top of said mounting stand, and a predetermined processing is performed, said method comprising the steps of:

setting a threshold flowrate value which corresponds to a flowrate measured by a flowmeter when the heat-transfer gas is leaking from between said object and a surface of said mounting stand in a normal state;

measuring a flowrate of said heat-transfer gas while said heat-transfer gas is being supplied;

comparing the measured flowrate of the heat-transfer gas and said threshold flowrate value;

outputting an abnormality detection signal when the measured flowrate exceeds the threshold flowrate value; and upon outputting of the abnormality signal, conveying the object out of a vacuum processing vessel without performing the processing if the abnormality detection signal is output before the processing, and interrupting the processing if the abnormality detection is output during the processing.

2. A vacuum processing apparatus comprising:

a vacuum processing vessel for performing vacuum processing on an object to be processed;

a mounting stand provided within said vacuum processing vessel and having a surface on which said object to be processed is mounted;

heat-transfer gas ejection holes formed in said surface, to supply a heat-transfer gas into a gap formed between said object to be processed and said surface in order to maintain said object mounted on said surface of said mounting stand at a predetermined temperature;

a gas supply path for supplying a heat-transfer gas to said gas ejection holes;

a heat-transfer gas supply source connected to said gas supply path;

a pressure adjustment device provided in said gas supply path, for adjusting the pressure of said heat-transfer gas within said gas supply path;

a flowmeter provided in a downstream side of said gas supply path from said pressure adjustment device, for measuring the flowrate of said heat-transfer gas towards said gas ejection holes; and a comparator for comparing said flowrate measured by said flowmeter against a threshold value, which corresponds to a flowrate measured by said flowmeter when said heat-transfer gas is leaking from between said object and said surface of said mounting stand in a normal state, and outputting a detection signal if said measured flowrate exceeds said threshold value;

wherein said object is conveyed out of the vacuum processing vessel without performing the processing if the detection signal is output before the processing, and the processing is interrupted if the detection signal is output during the processing.

3. The vacuum processing apparatus as defined in claim 2, further comprising pressing means for pressing said object to be processed onto said surface of said mounting stand.

4. The vacuum processing apparatus as defined in claim 3, wherein said mounting stand is formed of a dielectric material and said pressing means is an electrostatic chuck comprising electrodes for electrostatic attraction that are provided adjacent to the surface of said mounting stand.

5. The vacuum processing apparatus as defined in claim 2, wherein said pressure adjustment device is adjusted in such a manner that said gas in said gas supply path has a preset pressure that is selected from within the range of 1 to 20 Torr.

6. The vacuum processing apparatus as defined in claim 3, wherein said surface of said mounting stand has a mirror finish and said pressing means is set to press said object against said surface of said mounting stand with a pressure of at least 500 g/cm$^2$.

7. The vacuum processing apparatus as defined in claim 2, wherein said pressure adjustment device comprises a pressure gauge for detecting the pressure in said gas supply path, a controller for comparing a value detected by said pressure gauge against a set pressure value and outputting an output signal, and a pressure adjustment valve controlled in accordance with said output signal from said controller.

* * * * *